(12) United States Patent
Song et al.

(10) Patent No.: US 9,659,629 B2
(45) Date of Patent: *May 23, 2017

(54) SENSE AMPLIFIER DRIVING DEVICE

(71) Applicant: SK hynix Inc., Icheon-si, Gyeonggi-do (KR)

(72) Inventors: Jun Yong Song, Seoul (KR); Jong Ho Son, Icheon-si (KR); Saeng Hwan Kim, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/253,389

(22) Filed: Aug. 31, 2016

(65) Prior Publication Data

US 2016/0372176 A1    Dec. 22, 2016

Related U.S. Application Data

(63) Continuation-in-part of application No. 14/818,093, filed on Aug. 4, 2015, now Pat. No. 9,460,775.

(30) Foreign Application Priority Data

Mar. 27, 2015  (KR) .................. 10-2015-0043256

(51) Int. Cl.
| | | |
|---|---|---|
| *G11C 7/00* | (2006.01) | |
| *G11C 11/4076* | (2006.01) | |
| *G11C 11/4091* | (2006.01) | |
| *G11C 11/4094* | (2006.01) | |
| *G11C 11/4074* | (2006.01) | |

(52) U.S. Cl.
CPC ...... *G11C 11/4076* (2013.01); *G11C 11/4074* (2013.01); *G11C 11/4091* (2013.01); *G11C 11/4094* (2013.01)

(58) Field of Classification Search
CPC .......... G11C 7/1006; G11C 7/14; G11C 7/062
USPC .................................. 365/189.07, 206, 207
See application file for complete search history.

(56) References Cited

U.S. PATENT DOCUMENTS 7,460,775 B2 * 12/2008 Umezu ................. G03B 17/02
359/557
2008/0080281 A1 * 4/2008 Seo .......................... G11C 5/14
365/205

* cited by examiner

*Primary Examiner* — Son Dinh
(74) *Attorney, Agent, or Firm* — William Park & Associates Ltd.

(57) ABSTRACT

A sense amplifier driving device, and more particularly, a technology for improving the post overdriving operation characteristic of a semiconductor device. A sense amplifier driving device includes a driving signal generation block configured to compare a reference voltage set by a voltage trimming signal and a level of a power supply voltage, and generate a pull-up driving signal for controlling an operation of a sense amplifier; and a sense amplifier driving block configured to supply a driving voltage to a pull-up power line of the sense amplifier for an active operation period in correspondence to the pull-up driving signal, the driving signal generation block including a voltage divider configured to divide the power supply voltage, and output a divided voltage; and a voltage comparison section configured to compare the reference voltage and the divided voltage, and output a control signal for controlling an overdriving operation of the sense amplifier.

20 Claims, 14 Drawing Sheets

SENSE AMPLIFIER DRIVING DEVICE

CROSS-REFERENCES TO RELATED APPLICATION

The present application is a continuation in part of U.S. application Ser. No. 14/818,093, filed on Aug. 4, 2015, and the present application claims priority under 35 U.S.C. §119(a) to Korean application number 10-2015-0043256, filed on Mar. 27, 2015, in the Korean Intellectual Property Office, which is incorporated herein by reference in its entirety.

BACKGROUND

1. Technical Field

Various embodiments generally relate to a sense amplifier driving device, and more particularly, to a technology for improving the post overdriving operation characteristic of a semiconductor device.

2. Related Art

Semiconductor memory devices are being developed to increase the degree of integration and the operating speeds of the semiconductor memory devices. In order to increase the operating speeds of the semiconductor memory devices, a synchronous memory device has been developed. This synchronous memory device is capable of operating in synchronization with a clock signal received from outside a memory chip.

For example, an SDR (single data rate) synchronous memory device may be implemented whereby data is inputted and outputted through a single data pin during a single clock cycle. In the SDR synchronous memory device, the input and output of the data is in synchronization with the rising edge of a clock signal.

However, the SDR synchronous memory device has difficulty in operating with systems which require high speed operations. Accordingly, a DDR (double data rate) synchronous memory device may be implemented whereby data is consecutively inputted and outputted through each data input/output pin, in synchronization with the rising edge and the falling edge of a clock signal.

As such, a bandwidth at least two times wider than the conventional SDR synchronous memory device may be realized without increasing the frequency of a clock signal, and thus, a high speed operation may be achieved.

Among semiconductor memory devices, a DRAM (dynamic random access memory) is a representative volatile memory. The memory cell of the DRAM is constructed by a cell transistor and a cell capacitor.

The cell transistor functions to control an access to the cell capacitor, and the cell capacitor stores charges corresponding to data. That is to say, according to the amount of the charges stored in the cell capacitor, data of a high level or data of a low level is determined.

If a word line is activated in a semiconductor memory device, charge sharing occurs between a bit line and a bit bar line, and then, a sense amplifier operates. The sense amplifier performs initially an overdriving operation by using an external voltage VDD for a predetermined pulse period, such that the bit line or the bit bar line may quickly reach a target voltage level.

In this regard, as the power supply voltage of a semiconductor memory device gradually decreases, a core voltage (VCORE) decreases as well. Due to this fact, as the amount of charges of the cell of a DRAM decreases, the refresh and tWR (a time during which a precharge command may be applied after a point of time at which a write command is applied) characteristics of the DRAM may deteriorate.

In order to cope with this problem, a post overdriving (POD) operation is performed, in which the charging voltage of the cell is momentarily increased during only the final part of a period in which charges are transferred to the cell. However, an external voltage may be a high voltage or a low voltage according to a system. Therefore, in the case where the POD operation is performed regardless of the level of a power supply voltage, an efficient sense operation may not be performed.

In other words, if a power supply voltage is high, as a pair of bit lines are excessively overshot, unnecessary current consumption is caused. Conversely, if the power supply voltage is low, the bit line or the bit bar line may not quickly reach the target voltage level, and thus, the stable speed of the semiconductor memory device may not be ensured.

SUMMARY

Various embodiments are directed to reducing unnecessary power consumption by controlling a post overdriving operation in correspondence to the level of a power supply voltage.

In an embodiment, a sense amplifier driving device may include: a sense amplifier driving block configured to supply a post overdriving voltage to a pull-up power line of a sense amplifier during a post overdriving operation period in correspondence to a third pull-up driving signal; and a driving signal generation block configured to compare a reference voltage set by a voltage trimming signal and a level of a power supply voltage, and generate the third pull-up driving signal for controlling whether to perform a post overdriving operation.

In an embodiment, a semiconductor device may include: a sense amplifier configured to sense and amplify data according to a voltage applied to a pull-up power line and a pull-down power line; and a sense amplifier driving device configured to compare a reference voltage set by a voltage trimming signal and a level of a power supply voltage, generate a third pull-up driving signal for controlling whether to perform a post overdriving operation, and selectively supply a post overdriving voltage to the pull-up power line during a post overdriving operation period in correspondence to the third pull-up driving signal.

In an embodiment, a sense amplifier driving device may include: a driving signal generation block configured to compare a reference voltage set by a voltage trimming signal and a level of a power supply voltage, and generate a pull-up driving signal for controlling an operation of a sense amplifier; and a sense amplifier driving block configured to supply a driving voltage to a pull-up power line of the sense amplifier for an active operation period in correspondence to the pull-up driving signal, the driving signal generation block including a voltage divider configured to divide the power supply voltage, and output a divided voltage; and a voltage comparison section configured to compare the reference voltage and the divided voltage, and output a control signal for controlling an overdriving operation of the sense amplifier.

According to the embodiments, by controlling a post overdriving operation in such a way as not to be performed in the case where the level of a power supply voltage is a high voltage level, advantages are provided in that a data retention time characteristic may be improved and unnecessary power consumption may be reduced.

DETAILED DESCRIPTION

Hereinafter, a sense amplifier driving device and a semiconductor device including the same will be described below with reference to the accompanying drawings through various examples of embodiments.

Figure 1:
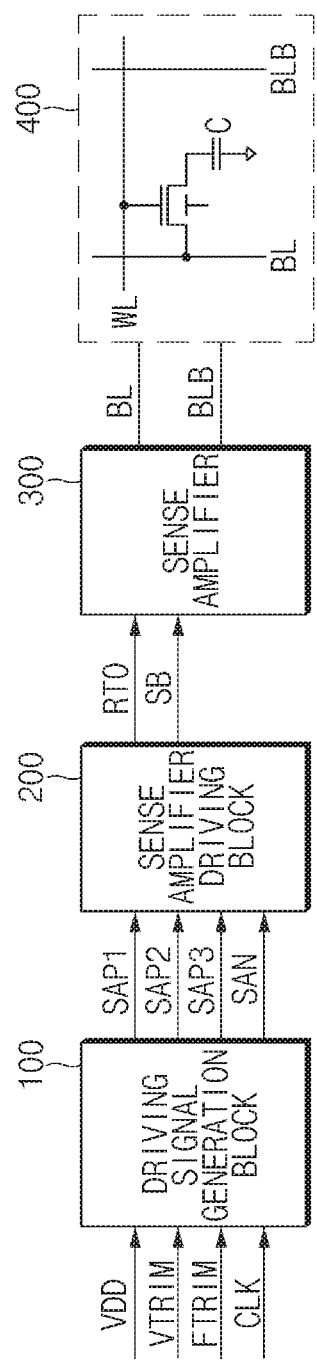
FIG. 1 is a configuration diagram illustrating a representation of an example of a semiconductor device in accordance with an embodiment.

FIG. 1 is a configuration diagram illustrating a representation of an example of a semiconductor device in accordance with an embodiment.

Data stored in the semiconductor device in accordance with the embodiment is identified as a high level (H) or a low level (L) in correspondence to a voltage level, and is expressed as '1' or '0'. A data value is differently identified according to a voltage level and a current magnitude. In the case of binary data, a high level is defined as a high voltage, and a low level is defined as a low voltage lower than the high level.

Referring to FIG. 1, the semiconductor device in accordance with the embodiment includes a driving signal generation block 100, a sense amplifier driving block 200, a sense amplifier 300, and a memory cell 400. In the present embodiment, the driving signal generation block 100 and the sense amplifier driving block 200 are collectively referred to as a "sense amplifier driving device".

The driving signal generation block 100 generates a plurality of pull-up driving signals SAP1 to SAP3 and a pull-down driving signal SAN in correspondence to a power supply voltage VDD, a voltage trimming signal VTRIM, a frequency trimming signal FTRIM and a clock CLK. The plurality of pull-up driving signals SAP1 to SAP3 and the pull-down driving signal SAN are enabled for respective predetermined periods, according to an active signal, a precharge signal, the power supply voltage VDD, the voltage trimming signal VTRIM, the frequency trimming signal FTRIM and the clock CLK. The active signal may be a signal which is enabled to a low level after a predetermined time from a point of time at which an active command is applied.

The sense amplifier driving block 200 supplies power to a pull-up power line RTO and a pull-down power line SB which are coupled with the sense amplifier 300, according to the pull-up driving signals SAP1, SAP2 and SAP3 and the pull-down driving signal SAN, and controls overdriving and post overdriving (POD) operations.

The sense amplifier driving block 200 drives the pull-up power line RTO to the levels of the power supply voltage VDD (a first pull-up voltage), a core voltage VCORE (a second pull-up voltage) and a post overdriving voltage VDD_POD (a third pull-up voltage) higher than the power supply voltage VDD, in response to the pull-up driving signals SAP1 to SAP3.

In particular, in the present embodiment, the driving signal generation block 100 may selectively control whether to enable the pull-up driving signal SAP3 which controls the post overdriving voltage VDD_POD, in correspondence to the power supply voltage VDD. For example, the driving signal generation block 100 disables the pull-up driving signal SAP3 in the case where the power supply voltage VDD is sufficiently high as a high voltage level, such that the post overdriving voltage VDD_POD is not supplied to the pull-up power line RTO.

The sense amplifier driving block 200 drives the pull-down power line SB to the level of a ground voltage VSS in response to the pull-down driving signal SAN. Also, the sense amplifier driving block 200 precharges the pull-up power line RTO and the pull-down power line SB to the level of an equalizing voltage VBLEQ in response to a precharge signal BLEQ.

The sense amplifier 300 operates according to the driving power applied to the pull-up power line RTO and the pull-down power line SB. Such a sense amplifier 300 senses and amplifies the data applied from the memory cell 400 through a pair of bit lines BL and BLB, and outputs the amplified data to a sensing line.

The memory cell 400 stores the data applied from the pair of bit lines BL and BLB or outputs stored data to the sense amplifier 300 through the pair of bit lines BL and BLB, when a word line WL is enabled.

The unit cell of the memory cell 400 includes one switching element T and one capacitor C. The switching element T is coupled between the bit line BL and the capacitor C, and selectively performs a switching operation according to the word line WL. The capacitor C is coupled between a cell plate voltage terminal and the switching element T, and stores data. If the word line WL is enabled, the switching element T is turned on, and the data applied from the bit line BL is stored in the capacitor C.

In the present embodiment having the above-described configuration, in an active mode, the core voltage VCORE is supplied to the pull-up power line RTO and the ground voltage VSS is supplied to the pull-down power line SB. Conversely, in an overdriving mode, the power supply voltage VDD higher than the core voltage VCORE is supplied to the pull-up power line RTO for a predetermined initial period. In a post overdriving mode, the post overdriving voltage VDD_POD higher than the power supply voltage VDD is supplied to the pull-up power line RTO for a predetermined last period.

In the present embodiment, after the memory cell 400 is disabled in a precharge mode, the equalizing voltage VBLEQ with the level of a bit line precharge voltage is supplied to the pull-up power line RTO and the pull-down power line SB.

The semiconductor device in accordance with the embodiment performs the overdriving operation during the development period of the pair of bit lines BL and BLB to increase a tRCD (a RAS to CAS delay time). Also, in the semiconductor device in accordance with the embodiment, the sense amplifier driving device performs the post overdriving operation during a post overdriving period before the word line WL is disabled (before a point of time at which the memory cell 400 is disabled). The post overdriving period is defined as a predetermined period before the word line WL of the memory cell 400 is disabled, before a precharge period.

For example, it is assumed that data of a high level is stored in the memory cell 400 and the sense amplifier 300 amplifies data of a high level and transfers the amplified data to the memory cell 400. The memory cell 400 is transferred with data by the post overdriving voltage VDD_POD with a level higher than the power supply voltage VDD and the ground voltage VSS, until immediately before it is disabled. Therefore, a data retention time in the state in which the memory cell 400 is disabled is increased.

In a write mode, the memory cell 400 is enabled, and write data is transferred to the pair of bit lines BL and BLB through the sensing line. The sense amplifier 300 senses and amplifies the write data of the pair of bit lines BL and BLB, and transfers the amplified write data to the memory cell 400.

For example, it is assumed that write data of a high level is transferred to the memory cell 400. The sense amplifier 300 transfers the write data to the memory cell 400 by the core voltage VCORE.

Thereafter, the memory cell 400 is transferred with data by the post overdriving voltage VDD_POD with the level higher than the power supply voltage VDD and the ground voltage VSS, until immediately before it is disabled in the precharge mode. Due to this fact, a time tWR during which a precharge command may be applied after a point of time at which a write command is applied may be shortened. In particular, a time for retaining data with the memory cell 400 disabled is increased.

The fact that the memory cell 400 is enabled means that the cell transistor T is turned on by the control voltage transferred through the word line WL and the cell capacitor C and the positive bit line BL are electrically coupled. Also, the fact that the memory cell 400 is disabled means that the cell transistor T is turned off.

The semiconductor device enters corresponding operation modes by the active command, the precharge command, write command, and so forth. In general, a corresponding operation mode is substantially entered after a predetermined time from a point of time at which a command signal is applied.

Further, in the semiconductor device, as the write command or a read command is applied between the active command and the precharge command, a data write operation or a data read operation is performed.

Figure 2:
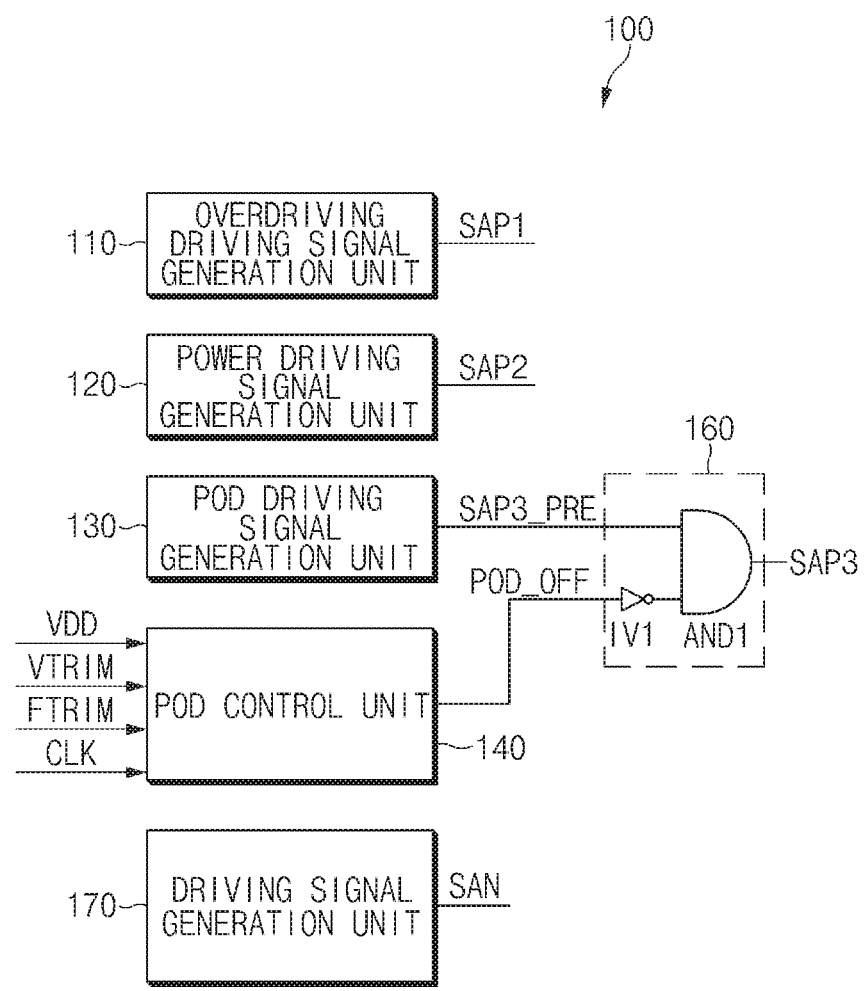
FIG. 2 is a detailed circuit diagram illustrating a representation of an example of the driving signal generation block shown in FIG. 1.

FIG. 2 is a detailed circuit diagram illustrating a representation of an example of the driving signal generation block 100 shown in FIG. 1.

The driving signal generation block 100 includes an overdriving driving signal generation unit 110, a power driving signal generation unit 120, a post overdriving (POD) driving signal generation unit 130, a POD control unit 140, a combination unit 160, and a driving signal generation unit 170.

The overdriving driving signal generation unit 110 generates the pull-up driving signal SAP1 for controlling the overdriving operation, in correspondence to a sense amplifier active signal. The power driving signal generation unit 120 generates the pull-up driving signal SAP2 for controlling a normal operation, in correspondence to the sense amplifier active signal. The POD driving signal generation unit 130 generates a driving signal SAP3_PRE for controlling the post overdriving operation, in correspondence to the sense amplifier active signal. The driving signal generation unit 170 generates the pull-down driving signal SAN for controlling the normal operation, in correspondence to the sense amplifier active signal.

The POD control unit 140 outputs a POD control signal POD_OFF in correspondence to the power supply voltage VDD, the voltage trimming signal VTRIM, the frequency trimming signal FTRIM and the clock CLK. Such a POD control unit 140 senses the level of the power supply voltage VDD, and enables the POD control signal POD_OFF for interrupting the POD operation in the case of a high voltage level.

The combination unit 160 combines the driving signal SAP3_PRE and the POD control signal POD_OFF, and selectively enables the pull-up driving signal SAP3. The combination unit 160 disables the pull-up driving signal SAP3 in the case where at least any one of the driving signal SAP3_PRE and the inverted signal of the POD control signal POD_OFF is a low level.

Such a combination unit 160 includes an inverter IV1 and an AND gate AND1. The AND gate AND1 performs an AND logic function on the driving signal SAP3_PRE and the inverted signal of the POD control signal POD_OFF which is generated as the POD control signal POD_OFF is inverted by the inverter IV1.

Figure 3:
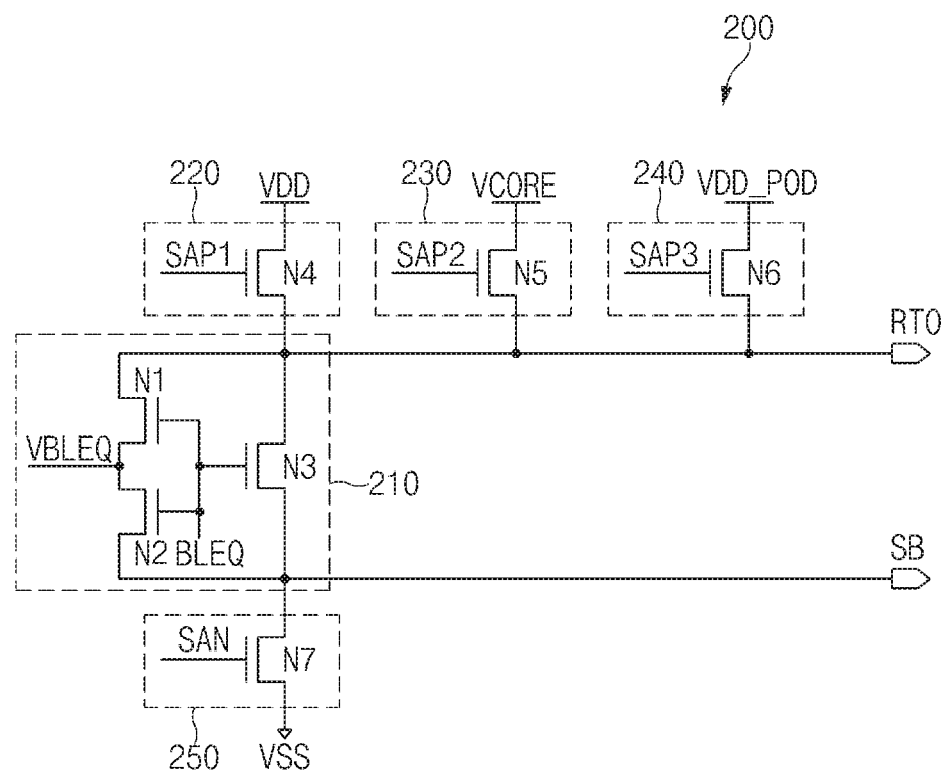
FIG. 3 is a detailed circuit diagram illustrating a representation of an example of the sense amplifier driving block shown in FIG. 1.

FIG. 3 is a detailed circuit diagram illustrating a representation of an example of the sense amplifier driving block 200 shown in FIG. 1.

The sense amplifier driving block 200 includes a precharge driving unit 210, pull-up driving units 220 to 240, and a pull-down driving unit 250.

The precharge driving unit 210 supplies the equalizing voltage VBLEQ to the pull-up power line RTO and the pull-down power line SB according to the precharge signal BLEQ in the precharge mode. Such a precharge driving unit 210 includes a plurality of NMOS transistors N1 to N3 of which gate terminals are coupled in common.

The NMOS transistor N1 is coupled between the application terminal of the equalizing voltage VBLEQ and the pull-up power line RTO, and the NMOS transistor N2 is coupled between the application terminal of the equalizing voltage VBLEQ and the pull-down power line SB. The NMOS transistor N3 is coupled between the pull-up power line RTO and the pull-down power line SB.

The pull-up driving unit 220 supplies the power supply voltage VDD being the overdriving voltage to the pull-up power line RTO when the pull-up driving signal SAP1 is enabled during an overdriving period. Such a pull-up driving unit 220 includes an NMOS transistor N4. The NMOS transistor N4 is coupled between the application terminal of the power supply voltage VDD and the pull-up power line RTO, and is applied with the pull-up driving signal SAP1 through the gate terminal thereof.

The pull-up driving unit 230 supplies the core voltage VCORE to the pull-up power line RTO when the pull-up driving signal SAP2 is enabled during an active period. Such a pull-up driving unit 230 includes an NMOS transistor N5. The NMOS transistor N5 is coupled between the application terminal of the core voltage VCORE and the pull-up power line RTO, and is applied with the pull-up driving signal SAP2 through the gate terminal thereof.

The pull-up driving unit 240 supplies the POD voltage VDD_POD to the pull-up power line RTO when the pull-up driving signal SAP3 is enabled during the post overdriving period. Such a pull-up driving unit 240 includes an NMOS transistor N6. The NMOS transistor N6 is coupled between the application terminal of the POD voltage VDD_POD and the pull-up power line RTO, and is applied with the pull-up driving signal SAP3 through the gate terminal thereof.

The pull-down driving unit 250 supplies the ground voltage VSS to the pull-down power line SB when the pull-down driving signal SAN is enabled during the active period. Such a pull-down driving unit 250 includes an NMOS transistor N7. The NMOS transistor N7 is coupled between the application terminal of the ground voltage VSS and the pull-down power line SB, and is applied with the pull-down driving signal SAN through the gate terminal thereof.

Figure 4:
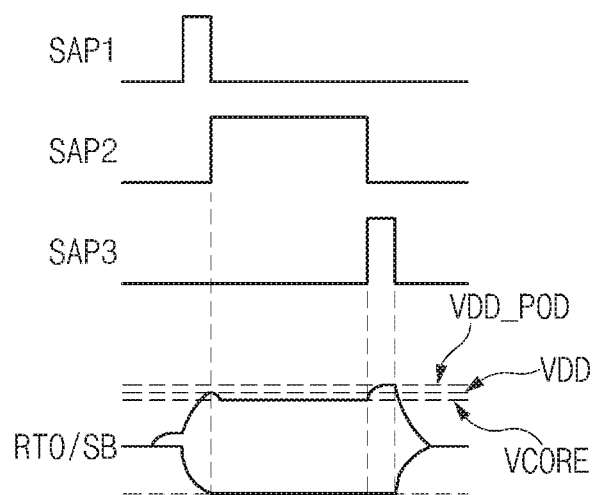
FIG. 4 is a representation of an example of an operation waveform diagram for the sense amplifier driving block shown in FIG. 3.

FIG. 4 is a representation of an example of an operation waveform diagram for the sense amplifier driving block 200 shown in FIG. 3.

If the pull-up driving signal SAP1 is enabled in the overdriving operation mode, the pull-up driving unit 220 operates. During the overdriving operation period, the power supply voltage VDD is applied to the pull-up power line RTO.

If the pull-up driving signal SAP2 is enabled in the normal active operation mode, the pull-up driving unit 230 operates. During the normal operation period, the core voltage VCORE is applied to the pull-up power line RTO.

If the pull-up driving signal SAP3 is enabled in the post overdriving operation mode, the pull-up driving unit 240 operates. During the POD operation period, the POD voltage VDD_POD higher than the power supply voltage VDD is applied to the pull-up power line RTO.

Figure 5:
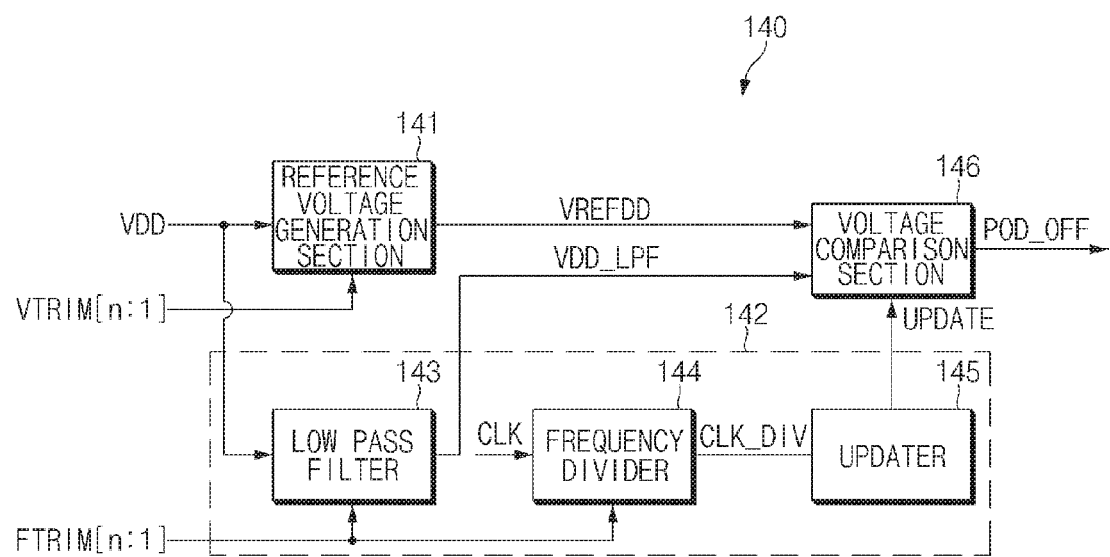
FIG. 5 is a detailed configuration diagram illustrating a representation of an example of the post overdriving control unit shown in FIG. 2.

FIG. 5 is a detailed configuration diagram illustrating a representation of an example of the post overdriving control unit 140 shown in FIG. 2.

The post overdriving control unit 140 includes a reference voltage generation section 141, a power noise removal section 142, and a voltage comparison section 146.

The reference voltage generation section 141 outputs a reference voltage VREFDD to the voltage comparison section 146 in correspondence to the power supply voltage VDD and the voltage trimming signal VTRIM. The reference voltage generation section 141 may trim the level of the reference voltage VREFDD within a specified range by the voltage trimming signal VTRIM[n:1]. For example, the reference voltage generation section 141 may change the reference voltage VREFDD through the voltage trimming signal VTRIM[n:1] from an exterior to set the power supply voltage VDD for applying POD, to an optimal value.

The power noise removal section 142 outputs a filtered power supply voltage VDD_LPF and an update signal UPDATE to the voltage comparison section 146 in correspondence to the power supply voltage VDD, the frequency trimming signal FTRIM and the clock CLK.

Such a power noise removal section 142 includes a low pass filter 143, a frequency divider 144, and an updater 145.

The low pass filter 143 removes noise from the level of the power supply voltage VDD, and generates the filtered power supply voltage VDD_LPF. For example, the low pass filter 143 removes a momentarily changing characteristic from the power supply voltage VDD, and attenuates the power supply voltage VDD to a voltage waveform with a gentle change. The low pass filter 143 may trim the time-dependent change characteristic (the frequency characteristic) of the filtered power supply voltage VDD_LPF within a specified range by the frequency trimming signal FTRIM[n:1]. The frequency trimming signal FTRIM[n:1] is a signal for determining the frequency characteristic of the power noise removal section 142.

The frequency divider 144 frequency-divides the clock CLK, and outputs a divided clock CLK_DIV to the updater 145. In the case where the time-dependent change of the filtered power supply voltage VDD_LPF is fast, a clock frequency may be controlled to be fast, by controlling the divided clock CLK_DIV. Conversely, in the case where the time-dependent change of the filtered power supply voltage VDD_LPF is slow, a clock frequency may be controlled to be slow, by controlling the divided clock CLK_DIV, and thus, power consumption may be reduced.

The frequency divider 144 may trim the divided clock CLK_DIV within a specified range by the frequency trimming signal FTRIM[n:1]. For example, the frequency divider 144 may change the frequency of the divided clock CLK_DIV through the frequency trimming signal FTRIM[n:1] from the exterior to set the clock CLK for applying POD, to an optimal value.

The updater 145 outputs the update signal UPDATE for controlling the voltage comparison section 146 in synchronization with the divided clock CLK_DIV, to the voltage comparison section 146. In other words, the updater 145 generates the update signal UPDATE for updating whether to perform the POD operation, as a pulse signal, and outputs the generated pulse signal to the voltage comparison section 146.

The voltage comparison section 146 compares and latches the reference voltage VREFDD and the filtered power supply voltage VDD_LPF, and outputs the POD control signal POD_OFF. The voltage comparison section 146 updates whether to perform the POD operation, during only a period in which the update signal UPDATE is a high level, such that an unnecessary update operation is not performed.

For example, the voltage comparison section 146 enables the POD control signal POD_OFF in the case where the filtered power supply voltage VDD_LPF is a level higher than the reference voltage VREFDD. Conversely, the voltage comparison section 146 disables the POD control signal POD_OFF in the case where the filtered power supply voltage VDD_LPF is a level lower than the reference voltage VREFDD. The voltage comparison section 146 controls the output of the POD control signal POD_OFF in synchronization with the clock of the update signal UPDATE.

Figure 6:
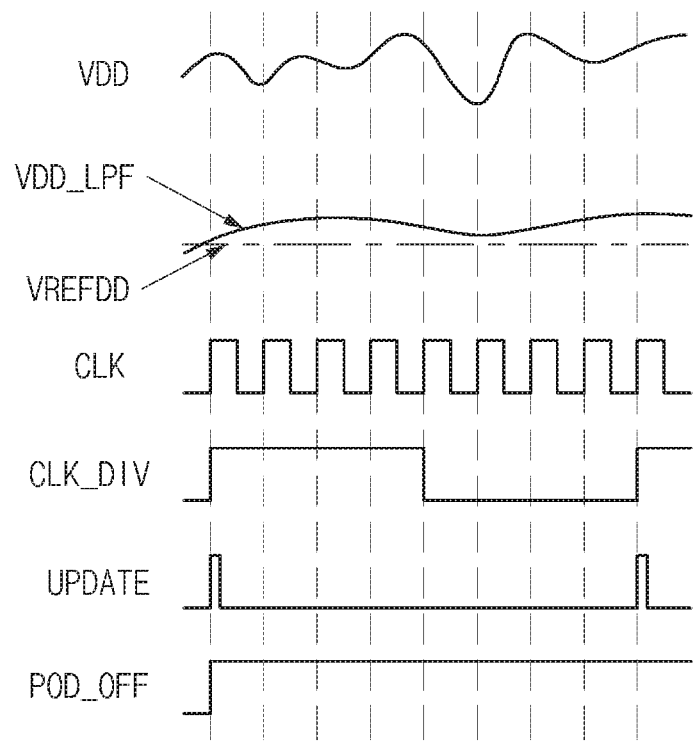
FIG. 6 is a representation of an example of an operation waveform diagram for the post overdriving control unit shown in FIG. 5.

An operation process for the post overdriving control unit 140 of FIG. 5 having the above-described configuration will be described below with reference to the operation waveform diagram of FIG. 6.

The reference voltage generation section 141 generates the reference voltage VREFDD in correspondence to the power supply voltage VDD, and outputs the reference voltage VREFDD to the voltage comparison section 146. The low pass filter 143 removes noise from the power supply voltage VDD, and outputs the filtered power supply voltage VDD_LPF to the voltage comparison section 146.

The frequency divider 144 frequency-divides the clock CLK, generates the divided clock CLK_DIV with a specified cycle, and outputs the divided clock CLK_DIV to the updater 145. The frequency divider 144 may output the divided clock CLK_DIV by dividing the clock CLK by the unit of 4 clocks or by the unit of 8 clocks, and a division unit is not specifically limited. The updater 145 generates a pulse signal which is enabled to a high level for a specified period from a point of time at which the divided clock CLK_DIV transitions to a high level, as the update signal UPDATE.

The voltage comparison section 146 compares the reference voltage VREFDD and the filtered power supply voltage VDD_LPF during a pulse period in which the update signal UPDATE is the high level, and controls the enable state of the POD control signal POD_OFF. The voltage comparison section 146 latches the POD control signal POD_OFF until another update signal UPDATE is enabled to the high level.

For example, the voltage comparison section 146 outputs the POD control signal POD_OFF to a high level in the case where the filtered power supply voltage VDD_LPF is a level higher than the reference voltage VREFDD during the pulse period in which the update signal UPDATE is the high level. Namely, in the case where the filtered power supply voltage VDD_LPF is a level higher than the reference voltage VREFDD, since it is meant that the power supply voltage VDD is raised to a targeted high voltage level, it is not necessary to perform the post overdriving (POD) operation.

In the case where the POD control signal POD_OFF is the high level, the output of the inverter IV1 becomes the low level. Then, the combination unit 160 disables the pull-up driving signal SAP3 regardless of the level of the driving signal SAP3_PRE. In this case, the pull-up driving unit 240 is turned off, and the POD voltage VDD_POD is not supplied to the pull-up power line RTO even during the post overdriving (POD) period. According to this fact, the post overdriving operation is not performed in the state in which the level of the power supply voltage VDD is sufficiently high, whereby it is possible to reduce unnecessary power consumption.

Figure 7:
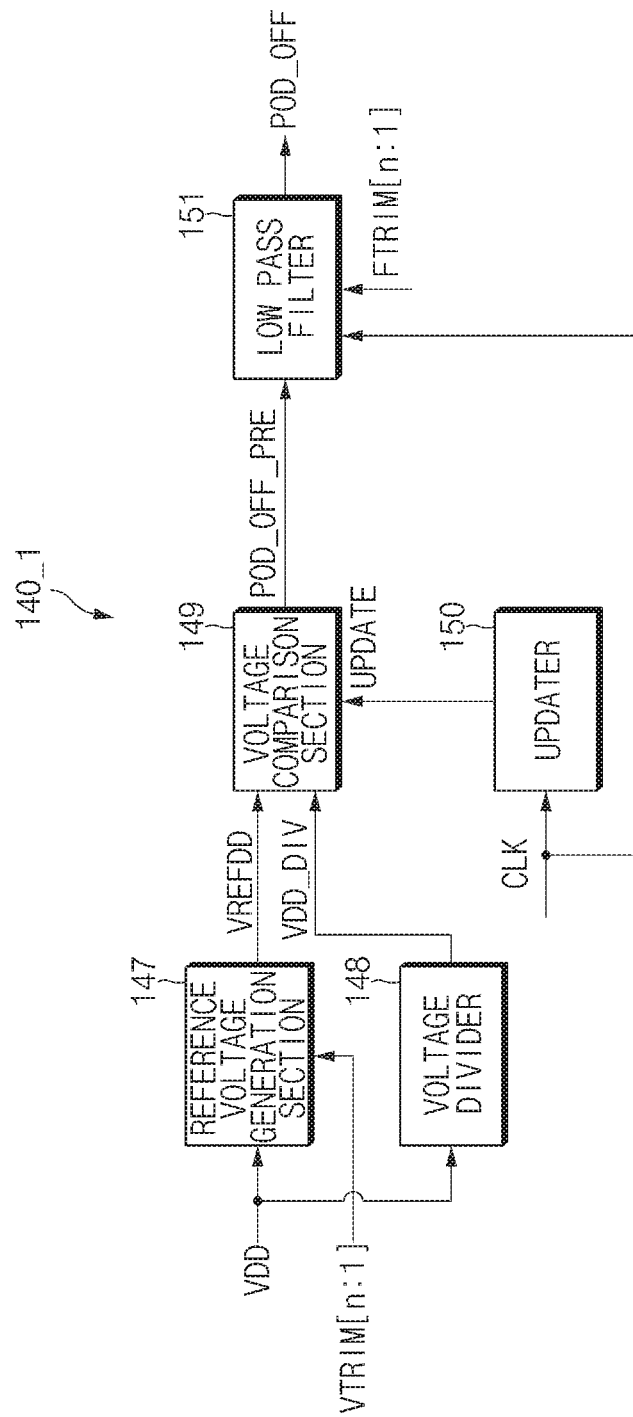
FIG. 7 is a detailed configuration diagram illustrating a representation of another example of the post overdriving control unit shown in FIG. 2.

FIG. 7 is a detailed configuration diagram illustrating a representation of another example of the post overdriving control unit 140_1 shown in FIG. 2.

The post overdriving control unit 140_1 includes a reference voltage generation section 147, a voltage divider 148, a voltage comparison section 149, an updater 150, and a low pass filter 151. As a low pass filter, which is generally realized by a resistor and a capacitor in the embodiment of FIG. 5 and occupies a relatively large area, is digitally realized in the embodiment of FIG. 7, an area may be decreased when compared to the embodiment of FIG. 5.

The reference voltage generation section 147 outputs a reference voltage VREFDD to the voltage comparison section 149 in correspondence to the power supply voltage VDD and the voltage trimming signal VTRIM. The reference voltage generation section 147 may trim the level of the reference voltage VREFDD within a specified range by the voltage trimming signal VTRIM[n:1]. For example, the reference voltage generation section 147 may change the reference voltage VREFDD through the voltage trimming signal VTRIM[n:1] from an exterior to set the power supply voltage VDD for applying POD, to an optimal value. The voltage divider 148 divides the power supply voltage VDD, and outputs a divided voltage VDD_DIV to the voltage comparison section 149.

The voltage comparison section 149 compares the reference voltage VREFDD and the divided voltage VDD_DIV, and outputs a control signal POD_OFF_PRE. The voltage comparison section 149 updates whether to perform the POD operation, during only a period in which an update signal UPDATE is a high level, such that an unnecessary update operation is not performed.

For example, the voltage comparison section 149 enables the control signal POD_OFF_PRE in the case where the divided voltage VDD_DIV is a level higher than the reference voltage VREFDD. Conversely, the voltage comparison section 149 disables the control signal POD_OFF_PRE in the case where the divided voltage VDD_DIV is a level lower than the reference voltage VREFDD. The voltage comparison section 149 controls the output of the control signal POD_OFF_PRE in synchronization with the clock of the update signal UPDATE.

The updater 150 outputs the update signal UPDATE for controlling the voltage comparison section 149 in synchronization with the clock CLK, to the voltage comparison section 149. In other words, the updater 150 generates the update signal UPDATE for updating whether to perform the POD operation, as a pulse signal, and outputs the generated pulse signal to the voltage comparison section 149.

The low pass filter 151 removes noise from the control signal POD_OFF_PRE, and generates a filtered POD control signal POD_OFF. The low pass filter 151 may trim the level of the POD control signal POD_OFF within a specified range by the frequency trimming signal FTRIM[n:1]. For example, the low pass filter 151 may change the frequency of the POD control signal POD_OFF through the frequency trimming signal FTRIM[n:1] from the exterior to set the clock CLK for applying POD, to an optimal value.

An operation process for the post overdriving control unit 140_1 of FIG. 7 having the above-described configuration will be described below with reference to the operation waveform diagram of FIG. 8.

The reference voltage generation section 147 generates the reference voltage VREFDD in correspondence to the power supply voltage VDD, and outputs the reference voltage VREFDD to the voltage comparison section 149. The voltage divider 148 divides the power supply voltage VDD, and outputs the divided voltage VDD_DIV to the voltage comparison section 149.

The updater 150 generates a pulse signal which is enabled to a high level for a specified period from a point of time at which the clock CLK transitions to a high level, as the update signal UPDATE, and outputs the update signal UPDATE to the voltage comparison section 149.

The voltage comparison section 149 compares the reference voltage VREFDD and the divided voltage VDD_DIV during a pulse period in which the update signal UPDATE is the high level, and outputs the control signal POD_OFF_PRE to the low pass filter 151.

For example, the voltage comparison section 149 outputs the control signal POD_OFF_PRE to a high level in the case where the divided voltage VDD_DIV is a level higher than the reference voltage VREFDD during the pulse period in which the update signal UPDATE is the high level. The voltage comparison section 149 latches the control signal POD_OFF_PRE until another update signal UPDATE is enabled to the high level. Namely, in the case where the divided voltage VDD_DIV is a level higher than the reference voltage VREFDD, since it is meant that the power supply voltage VDD is raised to a targeted high voltage level, it is not necessary to perform the post overdriving (POD) operation.

Conversely, the voltage comparison section 149 outputs the control signal POD_OFF_PRE to a low level in the case where the divided voltage VDD_DIV is a level lower than the reference voltage VREFDD during the pulse period in which the update signal UPDATE is the high level. Namely, in the case where the divided voltage VDD_DIV is a level lower than the reference voltage VREFDD, since it is meant that the power supply voltage VDD is a low voltage level, it is necessary to perform the post overdriving (POD) operation.

The low pass filter 151 removes noise from the control signal POD_OFF_PRE, and outputs the filtered POD control signal POD_OFF. In the present embodiment, the low pass filter 151 may control the logic state of the POD control signal POD_OFF by digitally filtering the control signal POD_OFF_PRE. Further, in the case where the low pass filter 151 is realized as a digital filter, the area of the filter may be decreased.

For example, by accumulating the number of the logic "1" states of the control signal POD_OFF_PRE during N clocks (for example, N=4), the logic state of the POD control signal POD_OFF may be controlled. That is to say, if the number of the logic "1" states of the control signal POD_OFF_PRE is larger than N/2, the POD control signal POD_OFF is outputted to a high level. Conversely, if the number of the logic "1" states of the control signal POD_OFF_PRE is smaller than or equal to N/2, the POD control signal POD_OFF is outputted to a low level.

Figure 8:
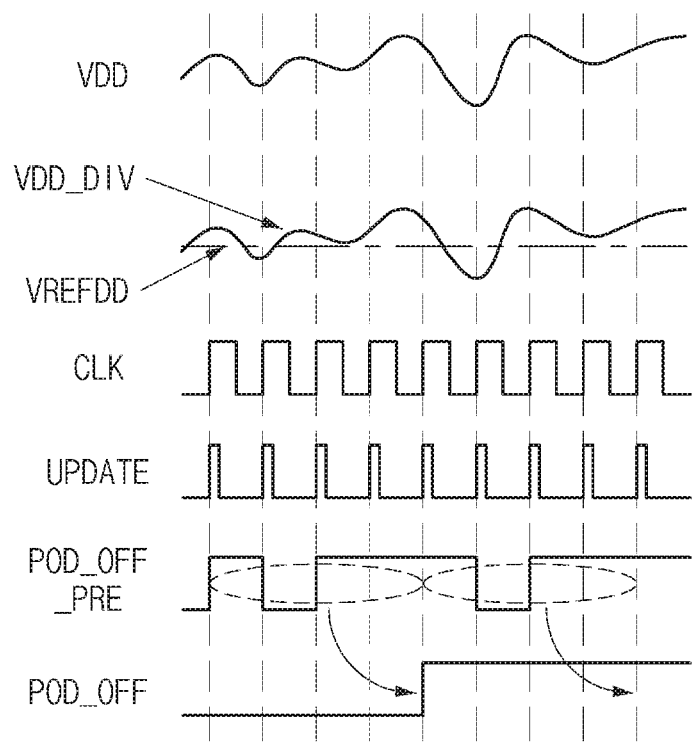
FIG. 8 is a representation of an example of an operation waveform diagram for the post overdriving control unit shown in FIG. 7.

In the timing diagram of FIG. 8, since the number of the logic "1" states of the control signal POD_OFF_PRE is "3" and is larger than N/2 (for example, N=4), the POD control signal POD_OFF is outputted to the high level such that the post overdriving operation is not performed.

In other words, in the case where the filtered POD control signal POD_OFF is the high level, the output of the inverter IV1 becomes the low level. Then, the combination unit 160 disables the pull-up driving signal SAP3 regardless of the level of the driving signal SAP3_PRE. In this case, the pull-up driving unit 240 is turned off, and the POD voltage VDD_POD is not supplied to the pull-up power line RTO even during the post overdriving (POD) period. According to this fact, the post overdriving operation is not performed in the state in which the level of the power supply voltage VDD is sufficiently high, whereby it is possible to reduce unnecessary power consumption.

Figure 9:
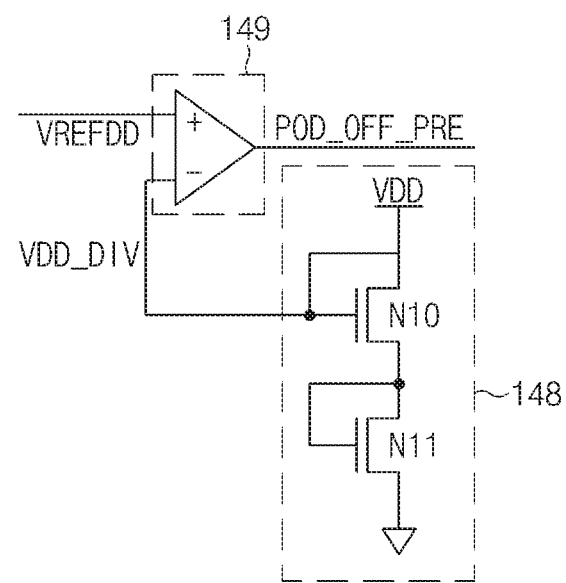
FIG. 9 is a detailed circuit diagram illustrating a representation of an example of the voltage divider and the voltage comparison section shown in FIG. 7.

FIG. 9 is a detailed circuit diagram illustrating a representation of an example of the voltage divider and the voltage comparison section shown in FIG. 7.

The voltage divider 148 divides the power supply voltage VDD, and outputs the divided voltage VDD_DIV to the voltage comparison section 149. Such a voltage divider 148 includes NMOS transistors N10 and N11. The NMOS transistors N10 and N11 are coupled in series between the application terminal of the power supply voltage VDD and the terminal of the ground voltage. In each of the NMOS transistors N10 and N11, a source terminal and a gate terminal are coupled in common. The NMOS transistor N10 outputs the divided voltage VDD_DIV through the gate terminal and the source terminal which are coupled in common.

The voltage comparison section 149 includes a comparator which compares the reference voltage VREFDD applied through a positive (+) terminal and the divided voltage VDD_DIV applied through a negative (−) terminal and outputs the control signal POD_OFF_PRE. The voltage comparison section 149 may operate during the activation period of the update signal UPDATE.

In the case of a conventional voltage divider, the level of a power supply voltage is detected by using a trimming signal. However, in the embodiment, the divided voltage VDD_DIV is generated by dividing the power supply voltage VDD through the NMOS transistors N10 and N11.

Figure 10:
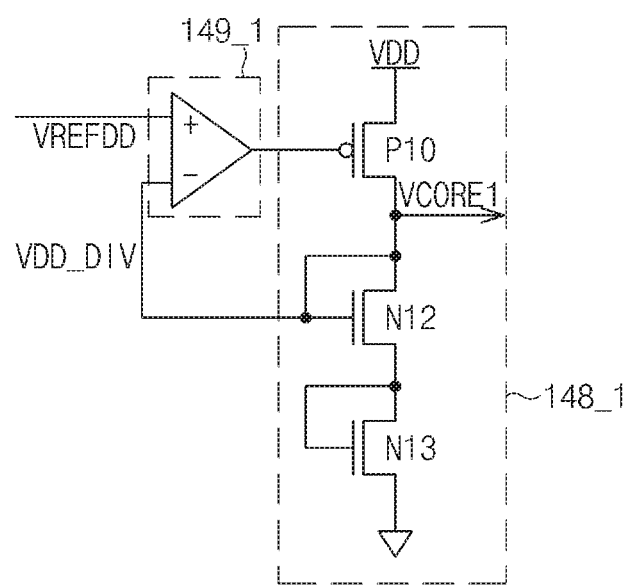
FIG. 10 is a detailed circuit diagram illustrating a representation of another example of the voltage divider and the voltage comparison section shown in FIG. 7.

FIG. 10 is a detailed circuit diagram illustrating a representation of another example of the voltage divider and the voltage comparison section shown in FIG. 7.

A voltage divider 148_1 may be realized in the type of a driver of an LDO (low drop out) scheme, which drives a core voltage VCORE1. Such a voltage divider 148_1 may generate the divided voltage VDD_DIV which has the level of the core voltage VCORE1 lower than the power supply voltage VDD.

The voltage divider 148_1 includes a PMOS transistor P10 and NMOS transistors N12 and N13. The PMOS transistor P10 is coupled between the application terminal of the power supply voltage VDD and the terminal of the core voltage VCORE1, and the output of a voltage comparison section 149_1 is applied through the gate terminal thereof. For example, the PMOS transistor P10 is turned on in the case where the output of the voltage comparison section 149_1 is a low level, and generates the core voltage VCORE1 lower than the power supply voltage VDD.

The NMOS transistors N12 and N13 are coupled in series between the application terminal of the core voltage VCORE1 and the terminal of the ground voltage. In each of the NMOS transistors N12 and N13, a source terminal and a gate terminal are coupled in common. The NMOS transistor N12 outputs the divided voltage VDD_DIV through the gate terminal and the source terminal which are coupled in common.

The voltage comparison section 149_1 compares the reference voltage VREFDD applied through a positive (+) terminal and the divided voltage VDD_DIV applied through a negative (−) terminal. In the case where the voltage divider 148_1 is realized in the type of an LDO driver, the dispersion of the divided voltage VDD_DIV may be improved.

Figure 11:
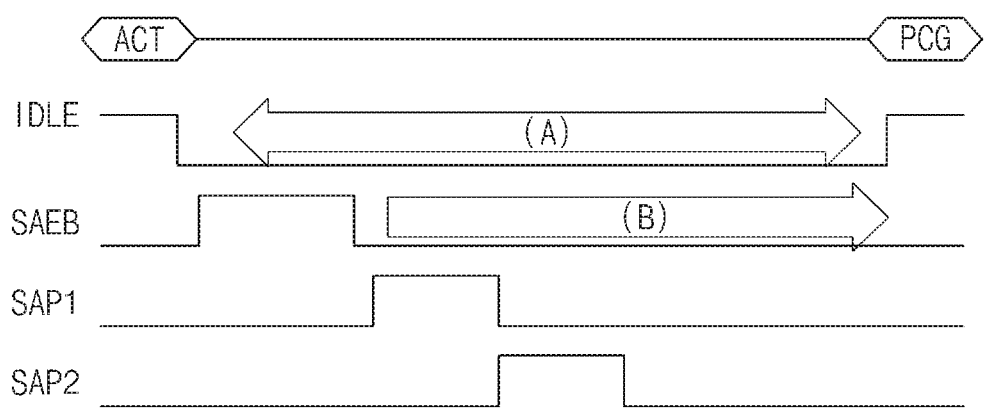
FIG. 11 is a representation of an example of a diagram to assist in the explanation of the operation of the driving signal generation block shown in FIG. 1.

FIG. 11 is a representation of an example of a diagram to assist in the explanation of the operation of the driving signal generation block 100 shown in FIG. 1.

As the sense amplifier driving device becomes an active state and an active signal ACT is enabled, an idle signal IDLE is disabled. Then, the driving of the sense amplifier 300 is started under the control of the sense amplifier driving block 200. A period (A) from a point of time when the active signal ACT is enabled to before a precharge signal PCG is applied becomes an enable period in which the output data of the sense amplifier 300 is detected.

A sense amplifier enable signal SAEB for enabling the sense amplifier 300 becomes a high level for a predetermined period. For the period in which the sense amplifier enable signal SAEB is the high level, a signal for controlling the driving of the sense amplifier 300 is latched and thus the sense amplifier 300 is not operated. The driving signal generation block 100 operates the updater 150 for the period in which the sense amplifier enable signal SAEB is the high level, that is, for the period in which the sense amplifier 300 does not operate, to update the voltage comparison section 149 and the sense amplifier 300 to be synchronized with the clock CLK.

If the sense amplifier enable signal SAEB is activated to a low level, the pull-up driving signals SAP1 and SAP2 are sequentially enabled. Then, as the sense amplifier 300 is driven for a period (B), sensing data is outputted.

Thereafter, if the precharge signal PCG is enabled and the period (A) expires, the idle signal IDLE is activated again. Then, the driving of the sense amplifier 300 is interrupted, and sensing data is not outputted.

Figure 12:
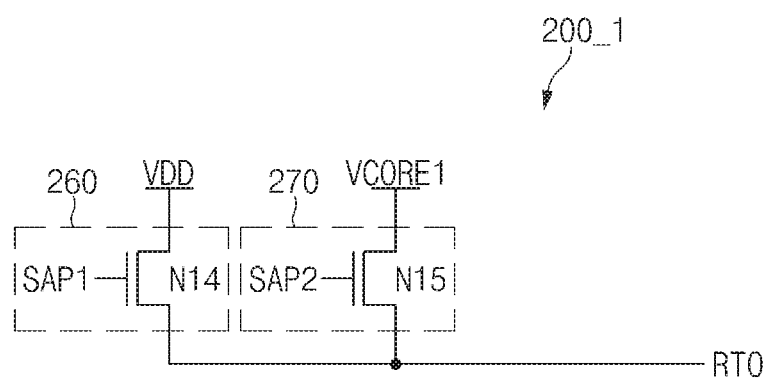
FIG. 12 is a detailed circuit diagram illustrating a representation of an example of the sense amplifier driving block shown in FIG. 1.

FIG. 12 is a detailed circuit diagram illustrating a representation of an example of the sense amplifier driving block 200 shown in FIG. 1. In the embodiment of FIG. 12, descriptions will be made by taking an example that a sense amplifier driving block 200-1 operates by two pull-up driving signals SAP1 and SAP2. Since the operations of the precharge driving unit 210 and the pull-down driving unit 250 are the same as in FIG. 3, detailed descriptions thereof will be omitted herein.

The sense amplifier driving block 200_1 includes pull-up driving units 260 and 270.

The pull-up driving unit 260 supplies the power supply voltage VDD to a pull-up power line RTO when the pull-up driving signal SAP1 is activated during an active period. The pull-up driving signal SAP1 may be a signal which is generated in the overdriving driving signal generation unit 110 of FIG. 2.

The pull-up driving unit 260 includes an NMOS transistor N14. The NMOS transistor N14 is coupled between the application terminal of the power supply voltage VDD and the pull-up power line RTO, and is applied with the pull-up driving signal SAP1 through the gate terminal thereof.

The pull-up driving unit 270 supplies the core voltage VCORE1 to the pull-up power line RTO when the pull-up driving signal SAP2 is activated during the active period. The core voltage VCORE1 has a level higher than the core voltage VCORE. The pull-up driving signal SAP2 may be a signal which is generated in the power driving signal generation unit 120 of FIG. 2.

The pull-up driving unit 270 includes an NMOS transistor N15. The NMOS transistor N15 is coupled between the application terminal of the core voltage VCORE1 and the pull-up power line RTO, and is applied with the pull-up driving signal SAP2 through the gate terminal thereof.

Figure 13:
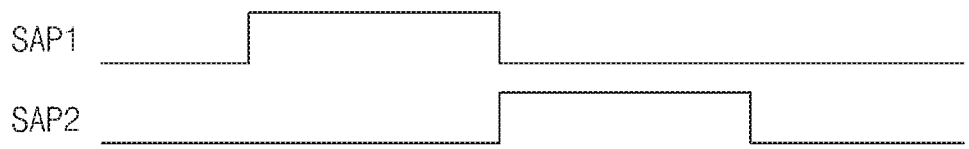
FIG. 13 is a representation of an example of an operation waveform diagram for the sense amplifier driving block shown in FIGS. 12.
Figure 13:
Figure 14:
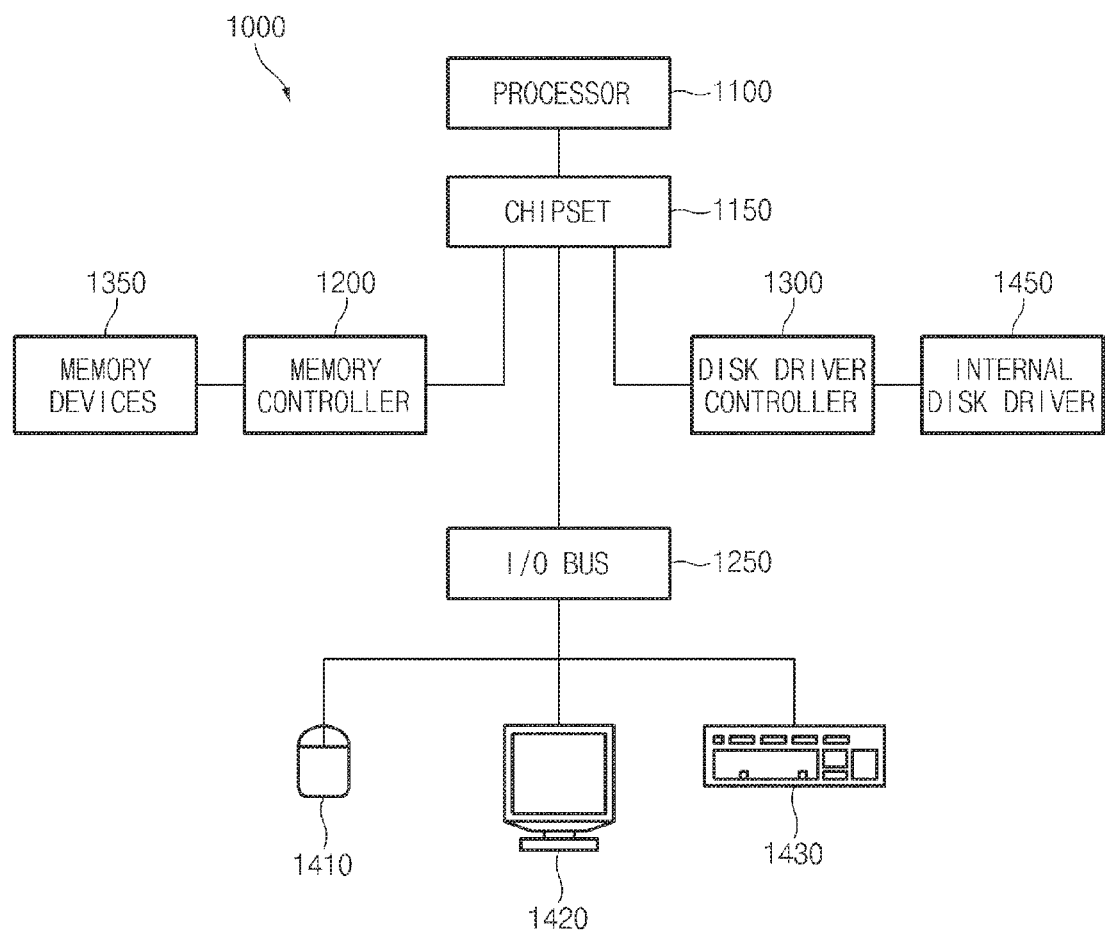
FIG. 14 illustrates a block diagram of an example of a representation of a system employing a sense amplifier driving device and/or semiconductor device in accordance with the various embodiments discussed above with relation to FIG. 1-13.

FIG. 13 is a representation of an example of an operation waveform diagram for the sense amplifier driving block 200_1 shown in FIG. 12.

In the sense amplifier driving block 200_1 according to the embodiment, the pulse width of the pull-up driving signal SAP1 is controlled differently depending on the potential values of the power supply voltage VDD and the core voltage VCORE1.

For example, in the case where the power supply voltage VDD has a voltage level lower than the core voltage VCORE1, the pulse width of the pull-up driving signal SAP1 becomes an activated state for a first period. Then, from a point of time when the pull-up driving signal SAP1 is disabled, the pull-up driving signal SAP2 is enabled for a predetermined period.

Conversely, in the case where the power supply voltage VDD has a voltage level higher than the core voltage VCORE1, the pulse width of the pull-up driving signal SAP1 becomes an activated state for a second period shorter than the first period. Then, from a point of time when the pull-up driving signal SAP1 is disabled, the pull-up driving signal SAP2 is enabled for a predetermined period.

That is to say, in the case where the potential of the power supply voltage VDD is lower than the core voltage VCORE1, the pulse width of the pull-up driving signal SAP1 is supplied for a long time (for the first period). In the case where the potential of the power supply voltage VDD is higher than the core voltage VCORE1, the pulse width of the pull-up driving signal SAP1 is supplied for only a short time (for the second period). In this case, it is possible to prevent current from being introduced from the application terminal of the power supply voltage VDD into the application terminal of the core voltage VCORE1.

So far, various embodiments have been described in detail. For reference, embodiments including additional component elements, which are not directly associated with the technical spirit of the present invention, may be exemplified in order to describe the present inventive concept in further detail. Moreover, an active high configuration or an active low configuration for indicating the activated states of signals and circuits may vary depending upon an embodiment. Furthermore, the configurations of transistors may be changed as the occasion demands in order to realize the same function. That is to say, the configurations of a PMOS transistor and an NMOS transistor may be replaced with each other, and as the occasion demands, various transistors may be employed. Since these circuit changes have a large number of cases and can be easily inferred by those skilled in the art, the enumeration thereof will be omitted herein.

While various embodiments have been described above, it will be understood to those skilled in the art that the embodiments described are by way of example only. Accordingly, the sense amplifier driving device and the semiconductor device including the same described herein should not be limited based on the described embodiments.

What is claimed is:

1. A sense amplifier driving device comprising:
 a driving signal generation block configured to compare a reference voltage set by a voltage trimming signal and a level of a power supply voltage, and generate a pull-up driving signal for controlling an operation of a sense amplifier; and
 a sense amplifier driving block configured to supply a driving voltage to a pull-up power line of the sense amplifier for an active operation period in correspondence to the pull-up driving signal,
 the driving signal generation block comprising:
  a voltage divider configured to divide the power supply voltage, and output a divided voltage; and
  a voltage comparison section configured to compare the reference voltage and the divided voltage, and output a control signal for controlling an overdriving operation of the sense amplifier.

2. The sense amplifier driving device according to claim 1, wherein the voltage comparison section comprises a first NMOS transistor and a second NMOS transistor which are coupled in series between an application terminal of the power supply voltage and a terminal of a ground voltage.

3. The sense amplifier driving device according to claim 2, wherein, in each of the first NMOS transistor and the second NMOS transistor, a source terminal and a gate terminal are coupled in common.

4. The sense amplifier driving device according to claim 2, wherein the first NMOS transistor outputs the divided voltage through the source terminal and the gate terminal which are coupled in common.

5. The sense amplifier driving device according to claim 1, wherein the voltage comparison section comprises a PMOS transistor, a third NMOS transistor and a fourth NMOS transistor which are coupled in series between an application terminal of the power supply voltage and a terminal of a ground voltage.

6. The sense amplifier driving device according to claim 5, wherein the PMOS transistor is coupled between the application terminal of the power supply voltage and a terminal of a core voltage, and an output of the voltage comparison section is applied through a gate terminal thereof.

7. The sense amplifier driving device according to claim 5, wherein, in each of the third NMOS transistor and the fourth NMOS transistor, a source terminal and a gate terminal are coupled in common.

8. The sense amplifier driving device according to claim 5, wherein the third NMOS transistor outputs the divided voltage through the source terminal and the gate terminal which are coupled in common.

9. The sense amplifier driving device according to claim 1, wherein the driving signal generation block further comprises:
an overdriving driving signal generation unit configured to generate a first pull-up driving signal for controlling the operation of the sense amplifier; and
a power driving signal generation unit configured to generate a second pull-up driving signal for controlling the operation of the sense amplifier.

10. The sense amplifier driving device according to claim 9, wherein the driving signal generation block latches a signal for controlling the operation of the sense amplifier, for a predetermined period, in a state in which an active signal is activated and a sense amplifier enable signal is deactivated.

11. The sense amplifier driving device according to claim 10, wherein the driving signal generation block retains a latching state until the first pull-up driving signal is enabled.

12. The sense amplifier driving device according to claim 9, wherein the driving signal generation block sequentially activates the first pull-up driving signal and the second pull-up driving signal.

13. The sense amplifier driving device according to claim 1, wherein the driving signal generation block further comprises:
a reference voltage generation section configured to trim the power supply voltage by the voltage trimming signal, and generate the reference voltage.

14. The sense amplifier driving device according to claim 1, wherein the driving signal generation block further comprises:
an updater configured to output an update signal which has a specified pulse period, in correspondence to a clock.

15. The sense amplifier driving device according to claim 14, wherein the update signal is a signal which is enabled to a high level for the specified pulse period from a point of time at which the clock transitions to a high level.

16. The sense amplifier driving device according to claim 14, wherein the voltage comparison section is activated by the update signal.

17. The sense amplifier driving device according to claim 1, wherein the sense amplifier driving block comprises:
a first pull-up driving unit configured to supply the power supply voltage to the pull-up power line in correspondence to a first pull-up driving signal; and
a second pull-up driving unit configured to supply a first core voltage to the pull-up power line in correspondence to a second pull-up driving signal.

18. The sense amplifier driving device according to claim 17, wherein, in the sense amplifier driving block, a pulse width of the first pull-up driving signal is controlled differently depending on potential values of the power supply voltage and the first core voltage.

19. The sense amplifier driving device according to claim 18, wherein, in the sense amplifier driving block, the first pull-up driving signal is activated for a first period in the case where the potential of the first core voltage is higher than the power supply voltage, and is activated for a second period in the case where the potential of the first core voltage is lower than the power supply voltage.

20. The sense amplifier driving device according to claim 19, wherein the first period is a period longer than the second period.

\* \* \* \* \*